US012763150B2

(12) United States Patent
Uzzan

(10) Patent No.: US 12,763,150 B2
(45) Date of Patent: Oct. 13, 2026

(54) DEVICE AND METHOD FOR AUTOMATED DATA ERASURE IN NON-VOLATILE MEMORIES OF ELECTRONIC DEVICES

(71) Applicant: Lionel Uzzan, Paris (FR)

(72) Inventor: Lionel Uzzan, Paris (FR)

( * ) Notice: Subject to any disclaimer, the term of this patent is extended or adjusted under 35 U.S.C. 154(b) by 106 days.

(21) Appl. No.: 18/873,856

(22) PCT Filed: Dec. 19, 2023

(86) PCT No.: PCT/EP2023/086751
§ 371 (c)(1),
(2) Date: Dec. 11, 2024

(87) PCT Pub. No.: WO2024/141349
PCT Pub. Date: Jul. 4, 2024

(65) Prior Publication Data

US 2025/0364054 A1 Nov. 27, 2025

Related U.S. Application Data

(63) Continuation-in-part of application No. 18/311,643, filed on May 3, 2023.

(30) Foreign Application Priority Data

Dec. 27, 2022 (EP) .................................... 22216839

(51) Int. Cl.
*G11C 16/18* (2006.01)
*G21F 3/00* (2006.01)
*H05G 1/32* (2006.01)

(52) U.S. Cl.
CPC ................ *G11C 16/18* (2013.01); *G21F 3/00* (2013.01); *H05G 1/32* (2013.01)

(58) Field of Classification Search
CPC ...................................................... G11C 16/18
(Continued)

(56) References Cited

U.S. PATENT DOCUMENTS 4,393,479 A * 7/1983 Du ......................... G11C 16/18
365/185.32
2009/0040805 A1* 2/2009 Park ....................... B82Y 10/00
365/111
(Continued)

FOREIGN PATENT DOCUMENTS

JP S59-75496 A 4/1984
JP 7033246 B2 3/2022

OTHER PUBLICATIONS

International Search Report issued in PCT/EP2023/086751; mailed Apr. 26, 2024.

*Primary Examiner* — Muna A Techane
(74) *Attorney, Agent, or Firm* — Studebaker Brackett PLLC

(57) ABSTRACT

An automated device and method for erasing data stored in non-volatile memories of electronic devices, such as smartphones or tablets, is disclosed. The device includes the use of an irradiation chamber having at least one X-ray source confined in a X-ray-tight enclosure, capable of receiving a plurality of electronic devices that can be brought into the chamber by a conveyor. A control unit controls the conveyor and the X-ray source to irradiate each electronic device with controlled power and duration for erasing data stored in the non-volatile memories of the electronic devices.

23 Claims, 3 Drawing Sheets

(58) Field of Classification Search
USPC ........................................................ 365/185.32
See application file for complete search history.

(56) References Cited

U.S. PATENT DOCUMENTS

| | | | | |
|---|---|---|---|---|
| 2009/0285362 | A1* | 11/2009 | Birnbach | H01J 35/065 378/122 |
| 2014/0022840 | A1* | 1/2014 | Tatsumura | H10D 64/035 257/204 |
| 2014/0233708 | A1* | 8/2014 | Ishiyama | H05G 1/54 378/207 |
| 2016/0133331 | A1* | 5/2016 | Hoeffgen | G11C 16/0416 365/185.32 |
| 2023/0012093 | A1* | 1/2023 | Kakushima | G11C 11/2275 |

* cited by examiner

DEVICE AND METHOD FOR AUTOMATED DATA ERASURE IN NON-VOLATILE MEMORIES OF ELECTRONIC DEVICES

FIELD

The present invention relates to the field of electronic devices containing non-volatile memories (NAND or NOR), for example such as computers, smartphones, tablets, or any type of device containing such memories. The invention particularly concerns the erasure of data contained in such memories.

BACKGROUND

Indeed, a problem in this field concerns the erasure of data contained in these memories, in particular in case of refurbishing or recycling these devices, to ensure that users' data cannot be retrieved by third parties without their consent. Conventionally, to erase data in this type of memory, the bits are reset by accessing the memory through computer resources using logic gates, which is tedious and requires to start the device which needs to be at least partially functional. For example, when a device is no longer functional to the point that the motherboard and/or main components must be repaired to launch a software erasure command, the preferred solution for now is to relegate the device for destruction by grinding and/or melting, which represents obvious waste in many ways (with significant economic and ecological issues). Furthermore, when these devices remain sufficiently functional for software access, a recurring problem concerns the fact that the many devices on the market have very different connectors and operating systems, which requires a wide variety of connectors and data access software. The time required for data erasure is therefore significant and problematic. Automating data erasure is therefore difficult to envisage in the current state of the prior art. On the other hand, the types of memories contained in these devices have various hardware architectures, more or less performant and resistant, which also complicates data erasure. It is also known in the prior art to erase memory data using ionizing radiation, in particular from patent applications U.S. Pat. No. 4,393,479 and JPS5975496. However, these solutions are deployed during the manufacture of memories of a specific and unique type, prior to their integration into a device, and are only intended to provide completely blank memories. These solutions therefore do not solve the problem of erasing data from a device while keeping it functional (hardware and/or software-wise).

SUMMARY

In this context, the present application proposes a device allowing reliable and rapid data erasure, avoiding the unnecessary destruction of devices as much as possible and preferably in a way compatible with the automation of various electronic device data erasure.

This objective is achieved by an automated device for erasing data stored in non-volatile memories of electronic devices, for example, wearable devices such as smartphones or tablets, characterized in that it comprises an irradiation chamber comprising at least one X-ray source confined in an enclosure hermetic to X-rays and capable of successively receiving a plurality of electronic devices that can be brought into the chamber by a conveyor, an identifier for identifying each of said devices to recognize the type of device and/or memory to be irradiated, a control unit controlling the conveyor and said X-ray source to irradiate each of the electronic devices with controlled power and duration according to irradiation parameters corresponding to the devices identified by the identifier, for erasing data contained in the non-volatile memories of said electronic devices.

According to another feature, said control unit determines, by means of said identifier, the location and type of memory of the devices to be irradiated and controls said conveyor and said X-ray source according to this determined location and type of memory.

According to another feature, the source generates an X-ray beam irradiating said devices along a main axis which is tilted or tiltable with respect to the plane of the conveyor, the angle of this main axis being determined by said control unit by means of said identifier.

According to another feature, the control unit controls the X-ray source by controlling the power and duration based on the type of memory contained in said electronic devices.

According to a further feature, said control unit is configurable to deliver a first type of irradiation with parameters providing a dose of less than 100 $m^2 \cdot s^{-2}$ (i.e., gray or joule/kilo), so as to limit the risks of damaging the device components, while allowing data erasure in the device memory to be incomplete but sufficient to impose a device reset at its next start-up, which involves a new installation of the operating system and a complete erasure.

According to another feature, said control unit is configurable to deliver a second type of irradiation with parameters providing a dose of between 200 and 1000 $m^2 \cdot s^{-2}$ (i.e., gray or joule/kilo), so as to enable total erasure of the data in the device memory requiring reprogramming of said memory, while limiting the risks of damaging device components.

According to another feature, the identifier comprises at least one computer file in which are listed the serial numbers or models of each of the successive devices arranged on the conveyor, said control unit determining the parameters to be used for each of the devices, from this file and from a database storing the characteristics of the devices.

According to another feature, the identifier comprises a code reader mounted on said devices.

According to another feature, the identifier comprises a recognizer for recognizing the components of the devices and their arrangement, from at least one image of the devices obtained by an imaging process using irradiation at a dose lower than that used for erasing the data in the memories.

According to another feature, the device comprises a preheating chamber for preheating the memories before they pass in front of the source.

According to another feature, the device includes a heating chamber at the outlet of the irradiation chamber to improve the condition of some device components after irradiation.

According to another feature, the device comprises a positioner capable of placing each of the successive devices in a position in three-dimensional space, which is determined as a function of the identification of the devices.

According to another feature, the device comprises at least one protective mask that can be positioned between the source and the devices to protect certain components of the devices during exposure of the memories to the irradiation source.

According to another feature, the control unit controls the irradiation power by controlling a supply voltage of the X-ray source between 175 and 300 kilovolts and a target intensity of the X-ray source between 250 microamperes and 100 milliamperes, preferably 20 milliamperes.

According to another feature, the X-ray source has a target made of Tungsten or Molybdenum.

According to another feature, the X-ray source has a window made of Beryllium or Aluminum.

According to another feature, the distance between said source and the conveyor transporting the devices is between 1 and 20 centimeters, preferably 2.5 to 4 centimeters.

Another object of the present application is to provide a reliable and fast data erasure method, avoiding unnecessary destruction of devices as much as possible and preferably compatible with the automation of electronic devices data erasure.

This object is achieved by a method of erasing data stored in non-volatile memories of electronic devices, for example portable devices, such as smartphones or tablets, characterized in that it comprises identification each of said devices to recognize the type of device and/or memory to be irradiated, determination, by a control unit, of irradiation parameters corresponding to the devices identified by the identifier, irradiating said electronic devices with at least one X-ray source confined in an X-ray-tight enclosure of an irradiation chamber capable of successively receiving a plurality of electronic devices that can be brought into the chamber by a conveyor, the conveyor and said X-ray source being controlled by said control unit as a function of said irradiation parameters, including the power and duration of irradiation for erasing the data contained in the non-volatile memory of said electronic devices.

According to another feature, said irradiation parameters include a main axis of an X-ray beam generated by said source, this axis being tilted or tiltable with respect to the plane of the conveyor and the angle of this main axis being determined by said control unit by means of said identifier.

According to another feature, said identification comprises a determination, by means of said identifier, of the location and type of memory of the devices to be irradiated, said control unit driving said conveyor and said X-ray source as a function of this location and type of memory determined during said irradiation.

According to another particularity, the control unit drives the X-ray source by controlling the power and duration according to the type of memory contained in said electronic devices.

According to another feature, irradiation involves adjusting the position of each of the successive devices relative to the source, depending on the components of the devices.

According to another feature, the process involves positioning at least one protective mask between the source and the devices to protect certain components of the devices during exposure of the memories to the irradiation source.

BRIEF DESCRIPTION OF THE FIGURES

Other features and advantages of the present invention will become more apparent from reading the description of various embodiments below, made with reference to the appended drawings, in which.

DETAILED DESCRIPTION

Figure 1:
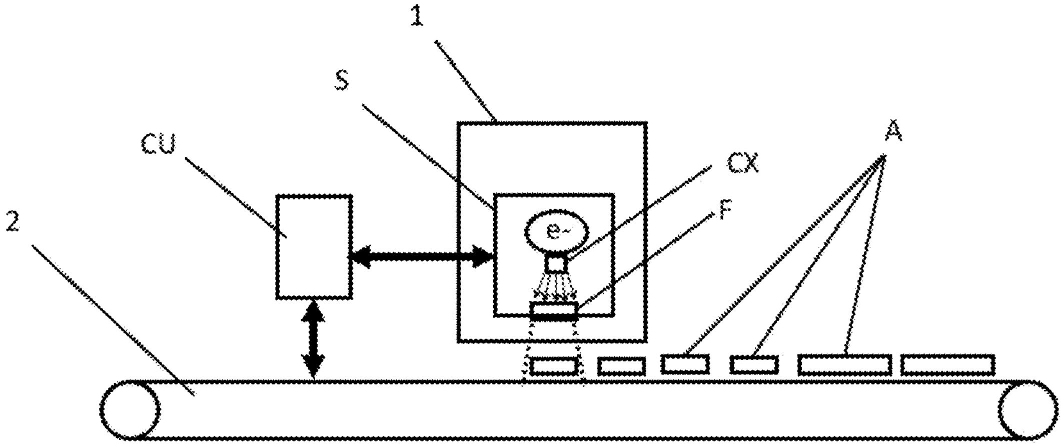
FIG. 1 depicts a schematic side view of an automated data erasure device according to various embodiments.

The present application relates to an automated device for erasing data stored in non-volatile memories (M) of electronic devices (A), such as portable devices like laptop smartphones or tablets, as well as solid-state disks (SSD) or any type of electronic device or data storage device containing non-volatile memory, such as “Flash” type memories. The term “non-volatile memories” encompasses, for example, NAND or NOR type memories (i.e., flash and/or EEPROM) based on semiconductor technology (MOS, “metal-oxide semiconductors”) using floating-gate transistors that trap one or more electrons (technologies known under the acronyms SLC, MLC or TLC) in charge traps (or cells), configured in the form of floating grids arranged in one or more layers (3D NAND technology), each electron corresponding to a bit of data that can be recorded and erased at will. Conventionally, to erase data in this type of memory, bits are reset by accessing the memory through computer resources using logic gates, whereas the present application proposes to erase data more quickly without requiring computer access to this type of memory, thanks to the use of X-rays calibrated to expel the trapped electrons in the charge traps. To this end, the present invention proposes a calibration of the irradiation that takes into account the architecture of non-volatile memories. The invention allows, for example, for the rapid erasure of personal data stored in memories of electronic devices, such as portable devices like smartphones or tablets or any other device integrating this type of memory (e.g., portable memories). The erasure of data is particularly important with regard to preserving the confidentiality of users’ personal data (e.g., in the context of the GDPR), especially when users’ devices or appliances are intended to be reconditioned or recycled. Data erasure is generally tedious, whereas the present invention allows for easy and rapid data erasure, providing advantages in terms of time and cost, regardless of the fate of the device whose data stored in its non-volatile memory needs to be erased. Moreover, for example, in the case of reconditioning, this data erasure should preferably avoid damaging other components of the device, and various embodiments of the invention enable to address this problem.

Furthermore, various embodiments of the present invention provide several “levels” (or “types”) of data erasure, depending on requirements (user wish and/or necessity, etc.). Indeed, unlike the solutions known in the prior art for erasing data by irradiation, which aim to erase memories in their entirety, possibly irreversibly, the present invention proposes to meet the need to prevent access to data while preserving the memories containing them and the other components of the devices in which they are present. To this end, some embodiments of the present invention propose not only to take into account the nature of the memories to be erased, but also the properties (hardware and software) of these devices. Indeed, in addition to taking precautions to avoid physically damaging device components, it is advantageous to take into account the software aspects of the devices to be irradiated. For example, a first "level" of irradiation is designed to achieve partial erasure of memories, making it impossible to access the data they contain, without altering the software restoration capabilities built into the devices. Indeed, devices such as smartphones or tablets integrate an operating system (software, e.g., iOS or Android) which manages the interoperability of the various components of the device. Some embodiments of the invention therefore propose to only partially erase the device's data, so that the operating system remains operational and requires the device to be reinitialized the next time it is started, which will result in the data being completely erased. In the event of such a partial deletion, the device detects an anomaly and requests a reinstallation of the operating system (OS). In general, this reinstallation will entail changing the encryption key used to encrypt data, making it impossible to read previously recorded data with the newly installed version. So, instead of having to access the device's software to completely erase the data-which would be costly, especially if it's not functional—an automated partial erasure by irradiation guarantees complete erasure before the device can be immediately reused, remaining capable of starting up and requiring only a complete reinitialization. A second "level" is also planned to irradiate the devices in a more intense way, causing total erasure, to the point of wiping out some of the data needed to run the device's operating system. This second level currently results in the device's inability to start up, and requires complete reprogramming of the memories, not least because in the case of 100% memory erasure (NAND), the operating system is erased at 100%, as is the microcontroller firmware on the memory chip itself. Depending on requirements, users can choose between these two erasure levels.

Thus, in some embodiments, the control unit (CU) is configurable to deliver a first type (or level) of irradiation with parameters providing a dose of less than 100 $m^2 \cdot s^{-2}$ (i.e., gray or joule/kilo), so as to limit the risk of damaging the device's components (A), while allowing data erasure in the device's memory (M) to be partial but sufficient to cause a restore mode of the device (A) at its next start-up. Electronic devices such as smartphones or tablets, for example, incorporate firmware (or embedded software), which is an integrated computer program that enables them to operate and evolve (via the installation of updates). When a device is partially erased in this way, it automatically starts up in restore or recovery mode, or in Device Firmware Update (DFU) mode, as the case may be (the difference being mainly in the bootloader). Such device boot modes require the reinstallation of a new OS, which in turn implies the installation of a new encryption key, making it impossible to read the data previously stored in the memory cells without damaging the device. Preferably, in such embodiments, the control unit (CU) drives the X-ray source to deliver irradiation for a duration of between 1 and 8 minutes, preferably 2 to 5 minutes. In this way, the dose received by the memory is sufficient to erase part of the data without risking damaging the memory and preserving the device functionality.

On the other hand, in certain embodiments, said control unit (CU) is configurable to deliver a second type of irradiation with parameters providing a dose of between 200 and 1000 $m^2 \cdot s^{-2}$ (i.e., gray or joule/kilo), so as to enable total erasure of data in the device's memory (M) requiring reprogramming of said memory (M), while limiting the risk of damaging device components (A). Preferably, in such embodiments, the control unit (CU) drives the X-ray source to deliver irradiation for a period of between 10 and 40 minutes, preferably 20 to 30 minutes. The device can then no longer be started up, even in restore mode or equivalent, and requires complete reprogramming (e.g., "from factory"), but the integrity of the memory remains preserved and the device can operate normally after reprogramming.

It is clear from the above that irradiation doses can be adjusted as a function of the device, not only at hardware level but also at software level. At hardware level, the sensitivity of the device depends on the irradiated memory and other components, and the sensitivity of this memory depends on its architecture and composition (in terms of the materials used), and all these aspects can be taken into account in the present invention.

Figure 3:
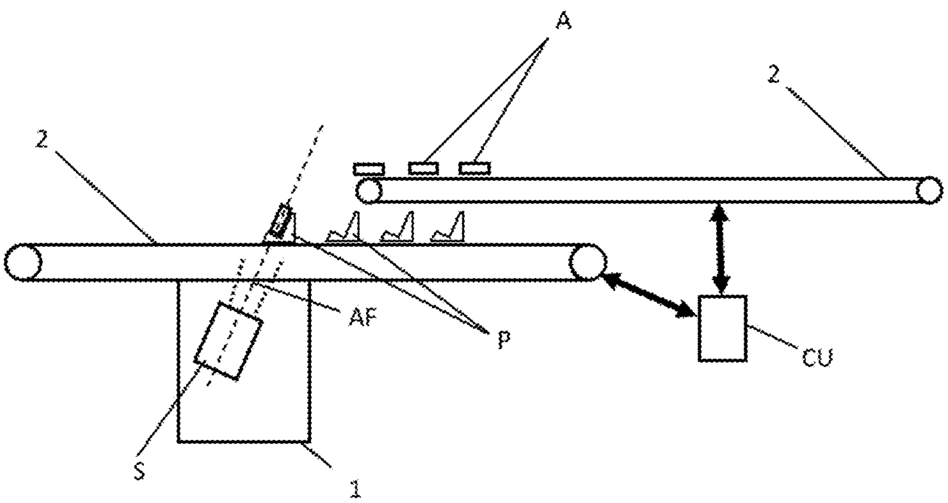
FIG. 3 shows a schematic side view of an automated data erasure device in various embodiments comprising a tiltable X-ray beam and device-positioning bases.
Figure 4:
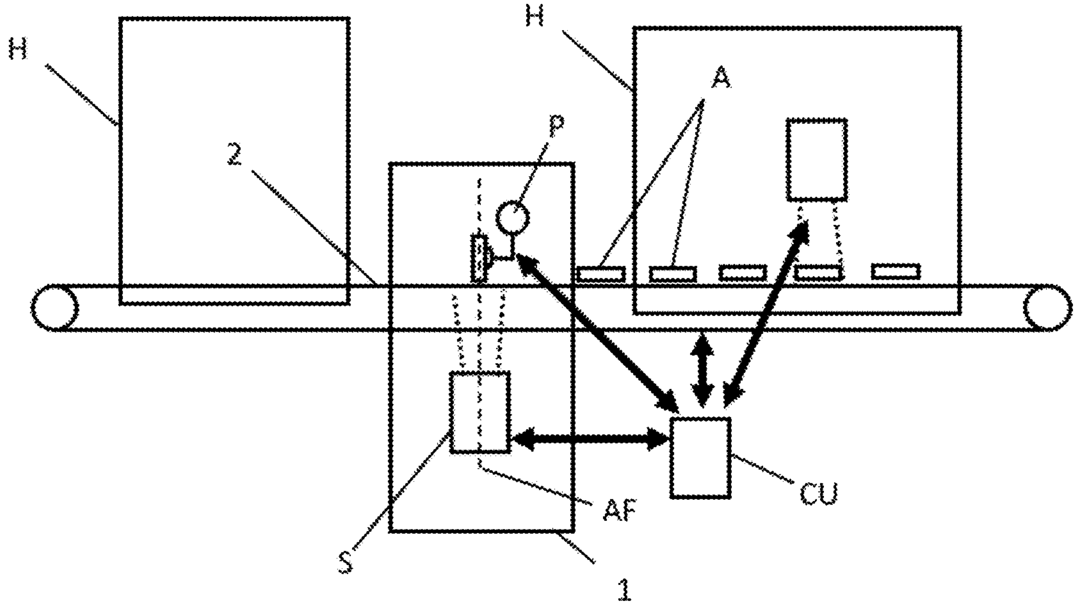
FIG. 4 shows a schematic side view of an automated data erasure device in various embodiments, comprising an identifier for identifying devices by imaging and a positioner of the devices.

The automated data erasure device according to various preferred embodiments of the invention is characterized by a radiation chamber (1) (or "cabin") comprising at least one X-ray source (S) confined in an enclosure hermetic to X-rays (or "X-ray-tight enclosure") and capable of successively receiving a plurality of electronic devices (A) which can be brought into the chamber (1) by a conveyor (2). Such an X-ray impermeable chamber (1) is known in the field and necessary to protect users, particularly due to the irradiation powers used for the implementation of the present invention. The conveyor (2) can, for example, be a conveyor belt on which the devices (A) to be irradiated are arranged successively, for example after their identification, as detailed below. On the other hand, the device comprises a control unit (CU) controlling the conveyor (2) and said X-ray source (S) to irradiate each of the electronic devices (A) with controlled power and duration for erasing the data contained in the non-volatile memories (M) of said electronic devices (A). The chamber (1) therefore has a hermetically sealed X-ray enclosure (i.e., X-ray-tight enclosure) into which the devices (A) enter through the conveyor, through at least one door (for example, a single door if the conveyor makes round trips through a single entrance-exit of the chamber or two doors if the conveyor crosses the chamber, such doors can for example slide perpendicularly to the plane of the conveyor, for example vertically) preferably preventing any escape of radiation from the chamber (1). These doors are controlled by the control unit (CU) when the devices (A) are moved in front of the X-ray source (S). The opening and closing of the doors will therefore be controlled according to the irradiation times of the devices (A) in the chamber (1), either individually device by device or by batches of several devices simultaneously. Regarding the irradiation and control of the source (S), the present applicant has observed that it is necessary to control both the power and the duration of irradiation of the various devices (A) due to the nature of the memories (M) and/or other components they contain, as detailed below. It will be understood from the present application and from the figures that the source can irradiate the devices from above (e.g. as in FIGS. 1 and 2) or from below (e.g. as in FIGS. 3, 4, 5 and 6), and that various configurations of chambers or tunnels and conveyors are possible, with a heater and/or image and/or position capture device (for tracking and/or aligning the devices in their path during the process) which are adapted to the controls performed by the control unit, as detailed in the present application. For example, FIG. 4 illustrates heating chambers (H) upstream and downstream of the irradiation chamber (1) and shows a preliminary view in the upstream heating chamber (H) for device identification, but the skilled person will understand that many variants are possible and that the figures represent only illustrative and non-limiting example.

Figure 2:
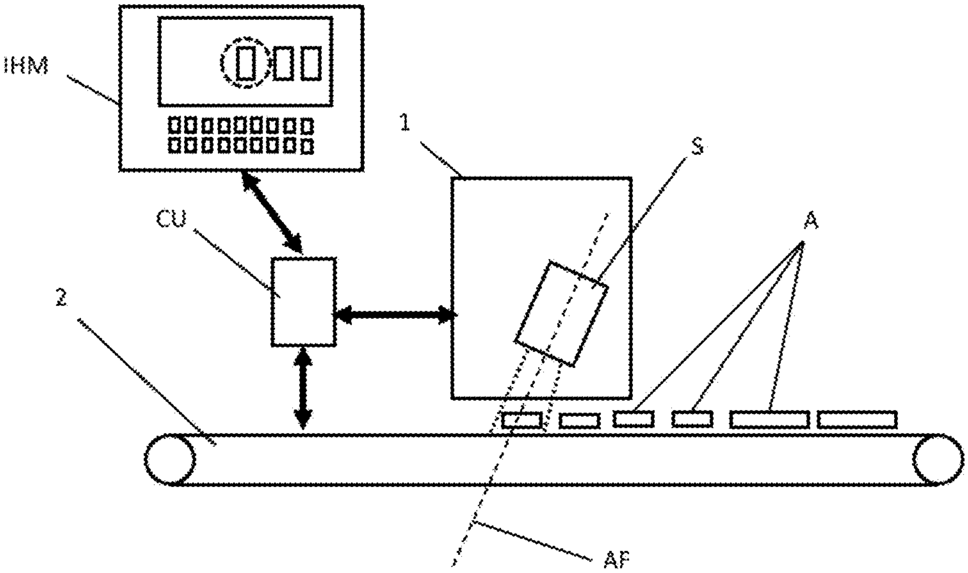
FIG. 2 depicts a schematic side view of an automated data erasure device according to various embodiments, comprising a tiltable X-ray beam.

In various preferred embodiments of the invention, the control unit (CU) drives the X-ray source by controlling the power and duration based on the type of memory (M) contained in the electronic devices (A). Indeed, depending on the type of memory (M) and their architecture, the applicant of the present application has observed that the duration and power of irradiation must be adjusted to ensure data erasure. For example, "cheap" or "low-end" memories are often more sensitive than higher-quality memories. On the other hand, certain memories (M) are designed to be protected from radiation, especially when electronic devices (A) pass through airport scanners. Thus, these memories require more power and duration than unprotected ones. Moreover, the location of memories (M) in electronic devices (A) varies greatly, to the point that some memories (M) are protected, intentionally or accidentally, by the presence of other components in the devices (A). Finally, there are three-dimensional structured memories, such as those using the technology known as 3D NAND or vertical NAND (V-NAND) which are non-volatile memories, in which cells are stacked vertically to increase storage density. This type of memory requires more irradiation and/or more elaborate irradiation (e.g. specific) than single-layer memories. It follows from all these aspects that, depending on the model of electronic device (A) in which data erasure is desired, it is necessary to know the type of memory and its location to control irradiation and adjust the power and duration, which affects the speed of the conveyor (2) that brings successive devices (A) into the chamber (1) and involves adjusting the power and/or duration of irradiation, in particular according to the desired "level" (or type) of erasure. Therefore, it is necessary for the control unit (CU) to be able to control these parameters, thanks to knowledge of the type of devices (A) and/or memories (M) to be irradiated, for example, by means of serial numbers of the devices (A). Device identifiers are therefore provided to enable the control unit to manage the operations required for each successive device (e.g. device cadence, irradiation power, beam and/or device tilting, etc.). This identification (i.e., knowledge) can be provided by a user entering the parameters used by the control unit or selecting the parameters to be used from a plurality of parameters stored in a memory of the control unit (CU). Preferably, the various devices (A) of the same type will be prepared in advance to be conveyed successively so that the parameters and speed are constant, but the invention provides for their variation depending on the type of devices (A) prepared on the conveyor. In certain embodiments, an identifier for identifying electronic devices (A) will be provided for automatic recognition of devices (A) and adjustment of irradiation parameters by the control unit using a memory storing the corresponding parameters for the recognized devices (A). In certain embodiments, one illustrative and non-limiting example of which is shown in FIG. 2, a human-machine interface (HMI) is provided to allow a user to control said irradiation parameters (using input or selection resources) and/or to monitor their progress (using an image capture device in the chamber displaying the irradiation area and the devices being irradiated). In some embodiments, the identifier comprises at least one computer file in which are listed the technical characteristics, for example via serial numbers or models, of each of the successive devices placed on the conveyor (2), said control unit determining the parameters to be used for each of the devices, on the basis of this file and a database storing the device characteristics (A). Such a database can be stored locally or remotely and enriched with each new device encountered.

In some embodiments, the identifier comprises a reader capable of reading a code previously affixed to said devices (A). Such a code may be a bar or a QR code or any other identity mark easily readable by a reader and enabling the devices processed by the device to be identified. Preferably, this code is used to track each of the devices as they are handled by the device or process of the present application, preferably with validation at each stage, so that a certificate of erasure can be issued on leaving the device (at the end of the method). In some embodiments, this device-identifying code can be generated from the order placed by a user wishing to have his or her data erased. When the device is received, the generated code is affixed to the device and identifies it until an erasure certificate is issued.

Device according to one of the preceding claims, characterized in that the identifier comprises a recognizer for recognizing the components of the devices and their arrangement, from at least one image of the devices obtained by an imaging process thanks to irradiation at a dose lower than that used for erasing the data in the memories (M). In fact, it is possible to use low-power irradiation (much lower than that used for erasure and, for example, of the order of that used in security gates, particularly at airports) to obtain an image of the device and determine which are its components, or even identify the model of the device, for example using artificial intelligence trained on a multitude of data from known electronic devices and programmed on a set of references, for example to extract the criteria relevant to the localization and identification of the components to be erased and protected. Such irradiation may be carried out by the source (S) used for erasure, but it is generally preferable to use another source upstream of the erasure chamber (e.g. as shown in FIG. 4). Thanks to such imaging, which preserves device components, the device can adjust irradiation parameters (beam and/or device tilting, power, duration, location of area to be irradiated and/or areas to be protected, e.g. by masks). For example, camera(s) in the heating tunnel upstream of the chamber will be used to identify the devices. The camera provides information on the characteristics of the device, which is then identified by an AI, which in turn provides information on targeting and radiation intensity for the irradiation chamber.

FIG. 1 shows a schematic view of the automated data erasure device according to various preferred embodiments. In some of these embodiments, the X-ray source includes a Tungsten or Molybdenum target (CX). This type of target proves particularly advantageous for delivering an effective X-ray beam for erasing data in the memories (M) of electronic devices (A) on the market. In addition, the applicant of the present application has observed that among the important parameters for irradiating memories (M) to erase data, the power supply voltage of the source was important, as well as the target intensity of the source. Thus, the selection of a voltage, a target, and a target intensity is necessary to obtain the desired results.

In some of these embodiments, the X-ray source comprises a Beryllium window (F). This type of window has the advantage of filtering out high-energy rays and allowing low-energy rays to pass through. The use of a low-thickness Beryllium window has been shown to be particularly advantageous for obtaining effective irradiation for data erasure. Aluminum is also an advantageous material for windows, not least because it filters low-energy photons. Various types of sources and windows are also possible.

Aluminum windows can also be used with different parameters. Indeed, depending on the materials used for the target and/or window, the voltage and intensity must be adjusted and the target intensity may vary depending on the case. Similarly, depending on the distance between the source (S) and the device to be irradiated, the parameters (especially the intensity) vary, and the skilled person can adjust the parameters to obtain effective irradiation according to the type of configuration chosen, particularly in terms of materials and distance between the target and device thanks to the explanations provided in the present application. For example, in the case of Beryllium windows, some embodiments provide that the control unit (CU) controls the irradiation power by controlling a supply voltage of the X-ray source between 175 (one hundred seventy-five) and 300 (three hundred) kilovolts and a target X-ray source intensity between hundreds of microamperes and tens of milliamperes, for example between 250 microamperes and 100 milliamperes, preferably of the order of 20 milliamperes. On the other side, the irradiation time strongly depends on the type of memory (M) present in the devices (A) to be irradiated. Thus, the control unit (CU) controls the X-ray source to deliver irradiation for a duration ranging from one to eight minutes, preferably two to five minutes.

On the other side, for example, in some embodiments, the distance between said source (S) and the devices or the conveyor conveying the devices is between one and twenty centimeters, particularly depending on the type of device, with computers generally requiring a different distance than smartphones. Nevertheless, the distance will preferably be 2.5 to 4 centimeters (two and a half to four centimeters) in many cases. Indeed, the applicant of the present application has observed that erasing is most effective when the memory to be erased is separated from the source (S) by only 2 to 3 centimeters, However, it is possible to have a greater distance, particularly with higher intensities and/or depending on the type of windows used.

On the other hand, it has been observed that memories are less likely to be damaged by ionizing radiation if they have been preheated. Various embodiments therefore provide for pre-heating of the devices upstream of the erasing chamber, preferably below a limit temperature of around 50° C., to preserve the components of the devices and in particular their batteries and/or screens. In addition, in some embodiments, device heating is provided at the exit from the erasure chamber (whether or not there is a preheating chamber upstream). For example, a heating tunnel may also be provided at the exit of the irradiation chamber, so that the heat can fill any holes induced by irradiation, especially on other components such as the microcontroller. In the case of devices with no heat-sensitive components (e.g. SSDs), the temperature of the heat tunnel at the outlet can reach temperatures of around 120°, to reduce post-processing time.

Figure 5:
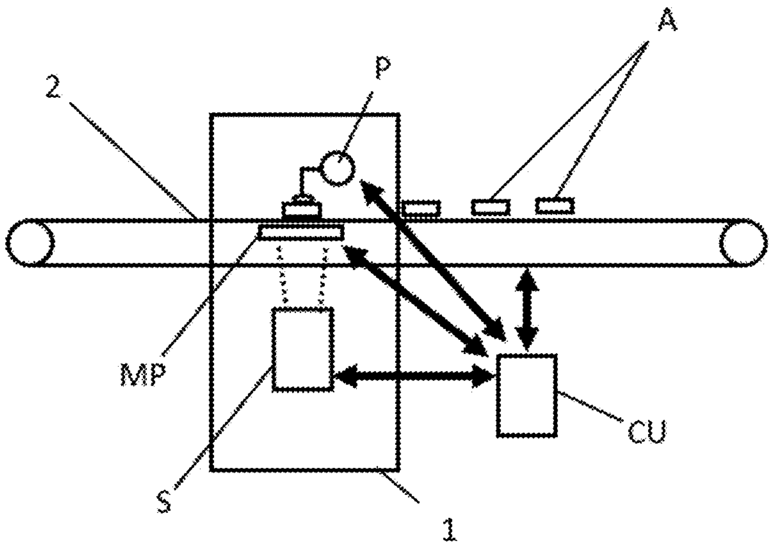
FIG. 5 shows a schematic side view of an automated data erasure device in various embodiments, comprising device a positioner and protective masks.

Generally speaking, device identification enables various irradiation parameters to be adjusted to achieve first-level or second-level erasure without damaging memories and other device components. Such adjustment generally involves limiting and targeting the area to be irradiated by controlling the relative positions and orientations (e.g., tilting) of the source and device, using a positioner (P) and/or protecting certain areas with protective masks. In some embodiments, the source (S) generates a beam of X-rays irradiating said devices (A) along a main axis (AF) that is tilted or tiltable with respect to the conveyor plane. Indeed, the applicant of the present application has observed that irradiation by a non-perpendicular beam to the conveyor plane allowed in some cases to facilitate data erasure, particularly in the case of memories with three-dimensional structures. Moreover, such an tilted beam often allows avoiding damaging other components of the electronic devices (A) whose memory contents are to be erased, or at least limiting the risks of damage. FIG. 2 represents an illustrative and non-limiting example of such embodiments with an tilted main axis (AF) of the X-ray beam. The control unit (CU) is then configured to control the beam tilting, for example under the control of a user using the human-machine interface (HMI) or under the control of parameters pre-recorded in a memory, depending on the identification of the device (A) to be irradiated. It is not necessary to describe here in more detail the control of the tilting of an X-ray beam which is widely known to those skilled in the art. From the present application, it will be understood that the tilting may be at a fixed angle determined based on the preferred angles for most known devices (A) or may be variable and adjusted by the control unit (CU) controlling a motor tilting the source and its beam, for example depending on the identification of successive devices (A) brought into the chamber (1). In some embodiments, the control unit (CU) also controls the tilting of the main axis of the beam according to the type of device present in the chamber (1). Thus, the main axis is tiltable at various angles with respect to the conveyor plane, so that the X-ray beam can optimally target the memories (M) according to their architecture and/or their positioning with respect to the other components of the device (A) containing them. Thus, said source (S) can be mounted on at least one motor configured for the displacement of the source (S) with respect to the conveyor. This displacement can thus be controlled by the control unit (CU) determining a focus on which the X-ray beam should be centered within the targeted device at each instant. Such a tilting of the ionizing radiation beam is particularly advantageous in the case of memories with an elaborate three-dimensional structure, such as the 3D-NANDs mentioned earlier in this description. As an alternative to, or in combination with, such beam tilting, various embodiments of the present invention also provide for the device (A) itself to be tilted so that the memories it contains can be irradiated optimally for data erasure, but also to preserve the device's other components, some of which may be particularly sensitive to ionizing radiation (such as OLED-type displays, for example, which imply that it is preferable to irradiate the device from its "edge", i.e. a lateral edge. In fact, the present application provides not only for beam tilting but also for device tilting to optimize their positioning relative to the beam. Device according to one of the preceding claims, characterized in that it comprises a positioner (P) capable of placing each of the successive devices in a position in three-dimensional space, which is determined as a function of the identification of the devices (A). Such a positioner may comprise, for example, receptacles or bases or molds (possibly fitted with protective masks), configured to accommodate the devices in an arrangement (orientation and position) optimized for the pre-preservation of their components during irradiation. FIG. 3 illustrates a non-limiting example of such bases for positioning devices (in combination with a tilting of the ionizing radiation beam). Such a positioner may also include device gripping means (e.g. articulated arms fitted with suction cups or grippers for gripping the devices), configured to arrange them in a suitable manner, which is determined by their identification. FIGS. 4 and 5 illustrate, in a non-limiting way, an example of such a positioner comprising an articulated gripper enabling, for example, the devices to be arranged as required (FIG. 4 representing an example where the device is arranged perpendicular to the plane of the conveyor in order to irradiate them without damaging their screen (in particular of the OLED type).

Figure 6:
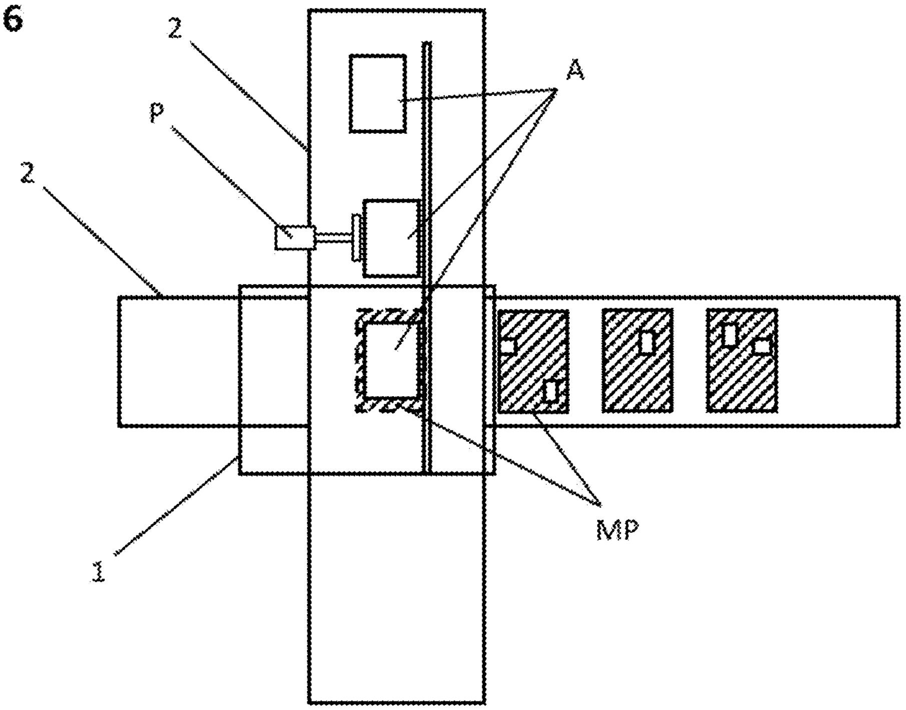
FIG. 6 shows a schematic side view of an automated data erasure device in various embodiments, comprising device a positioner and protective masks.

In addition to this positioning and targeting of the beam on the memories to be erased, it may be useful, or even necessary, to provide protection for certain components by material arrangement capable of stopping the radiation, such as lead plates or other suitable material known for this property. Thus, in some embodiments, the device comprises at least one protective mask (MP) positionable between the source and the devices to protect certain components of the devices (A) during exposure of the memories (M) to the irradiation source. Such masks can be obtained in many ways within the skills of the skilled person. The following are just a few illustrative and non-limiting examples. For example, a barrel can be fitted to the source, comprising a plurality of masks with radiation-tight zones. It will be understood that such hermetic zones can be made of various materials of different thicknesses, depending on the power of the irradiation (as a function of the absorption coefficient). Alternatively, it is possible to provide radiation-tight plates with shapes and dimensions adapted to at least one type of device, with provision for changing these plates according to successive devices. FIG. 6 provides a non-limiting example of such masks, which can be fed perpendicularly to the axis of the conveyor bringing the devices into the chamber, in order to interpose, between the source and the device, masks determined according to the identification of the devices It is understood that the present invention also concerns a reliable and fast method for data erasure, avoiding as much as possible the unnecessary destruction of devices and preferably compatible with the automation of electronic data erasure. Indeed, thanks to the configuration proposed and/or the parameters identified by the applicant of the present application, the invention also provides an effective method of data erasure allowing time savings and better preservation of the materials and components of the devices (A) which are a major source of pollution when destroyed.

The invention therefore relates to a method for erasing data stored in non-volatile memories (M) of electronic devices (A), for example portable devices such as smartphones or tablets, characterized in that it comprises irradiating said electronic devices (A) with at least one source (S) of X-rays confined in a X-ray-tight enclosure (or "enclosure hermetic to X-rays) of an irradiation chamber (1) able to successively receive a plurality of electronic devices (A) which can be brought into the chamber by a conveyor (2), the conveyor (2) and said source (S) of X-rays being controlled by a control unit (CU) controlling the power and duration of irradiation for erasing the data contained in the non-volatile memory (M) of said electronic devices (A). The various embodiments of the device described in the present application also apply to the method which may therefore comprise various steps and use various parameters according to the functionalities described in the present application. For example, the method may comprise a tilting of the ray beam adjusted by the control unit, as a function of the architecture of the device to be irradiated (e.g., the location of the memory with respect to other components).

The present application describes various technical features and advantages with reference to the figures and/or various embodiments. The skilled person will understand that the technical features of a given embodiment may actually be combined with features of another embodiment unless the reverse is explicitly stated or it is evident that these features are incompatible or that the combination does not provide a solution to at least one of the technical problems mentioned in this application. Moreover, the technical features described in a given embodiment may be isolated from the other features of that embodiment unless the reverse is explicitly stated.

DETAILED LIST OF REFERENCES IN THE FIGURES

M: non-volatile memory
A: electronic device
1: chamber
S: X-ray source
2: conveyor
CU: control unit
AF: main axis of the X-ray beam
CX: target of the X-ray source
F: window of the X-ray source
IHM: Human-Machine Interface
P: Positioner
MP: Protective mask
H: Heating Chamber

The invention claimed is:

1. Automated device for erasing data stored in non-volatile memories of electronic devices, said automated device comprising an irradiation chamber comprising at least one X-ray source confined in an X-ray-tight enclosure and capable of successively receiving a plurality of electronic devices to be brought into the chamber by a conveyor, an identifier for identifying each of said devices to recognize the type of device and/or memory to be irradiated, a control unit controlling the conveyor and said X-ray source to irradiate each of the electronic devices with controlled power and duration as a function of irradiation parameters corresponding to the devices identified by the identifier, for erasing data contained in the non-volatile memories of said electronic devices.

2. The device according to claim 1, wherein the control unit is configured to determine, by means of said identifier, the location and type of memory of the device to be irradiated and control said conveyor and said X-ray source as a function of the determined location and type of memory.

3. The device according to claim 2, wherein the source is configured to generate an X-ray beam irradiating said devices along a principal axis which is tilted or tiltable with respect to the plane of the conveyor, the angle of this principal axis being determined by said control unit by means of said identifier.

4. The device according to claim 1, wherein the control unit is configured to control the X-ray source by monitoring the power and duration as a function of the type of memory contained in said electronic devices.

5. The device according to claim 1, wherein said control unit is configurable to deliver a first type of irradiation with parameters providing a dose lower than 100 $m^2 \cdot s^{-2}$, so as to limit the risk of damaging the components of the device, while enabling data erasure in the device's memory that is partial but sufficient to impose a reset of the device at its next start-up, which implies a new installation of the operating system and a complete erasure.

6. The device according to claim 1, wherein said control unit is configurable to deliver a second type of irradiation with parameters providing a dose of between 200 and 1000 $m^2 \cdot s^{-2}$, so as to allow total erasure of the data in the memory of the device requiring reprogramming of said memory, while limiting the risks of damaging the components of the device.

7. The device according to claim 1, wherein the identifier comprises at least one computer file in which are listed the serial numbers or models of each of the successive devices arranged on the conveyor, said control unit configured to determine the parameters to be used for each of the devices, from this file and from a database storing the characteristics of the devices.

8. The device according to claim 1, wherein the identifier comprises a code reader configured to read a code affixed to said devices.

9. The device according to claim 1, wherein the identifier comprises a recognizer for recognizing the components of the devices and their arrangement, from at least one image of the devices obtained by an imaging process thanks to irradiation at a dose lower than that used for erasing the data in the memories.

10. The device according to claim 1, further comprising a preheating chamber for preparing the memories before they pass in front of the source.

11. The device according to claim 1, further comprising a heating chamber at the outlet of the irradiation chamber to improve the condition of certain components of the devices after irradiation.

12. The device according to claim 1, further comprising a positioner capable of placing each of the successive devices in a position in three-dimensional space, which is determined as a function of the identification of the devices.

13. The device according to claim 1, further comprising at least one protective mask able to be positioned between the source and the devices to protect certain components of the devices during exposure of the memories to the irradiation source.

14. The device according to claim 1, wherein the control unit controls the irradiation power by controlling a supply voltage of the X-ray source between 175 and 300 kilovolts and a target intensity of the X-ray source between 250 microamperes and 100 milliamperes.

15. The device according to claim 1, wherein the X-ray source comprises a target made of tungsten or molybdenum.

16. The device according to claim 1, wherein the X-ray source comprises a window made of beryllium or aluminum.

17. The device according to claim 1, wherein the distance between said source and the conveyor transporting the devices is between 1 and 20 centimeters.

18. A method for erasing data stored in non-volatile memories of electronic devices, said method comprising:

i. identifying each of said devices to recognize the type of device and/or memory to be irradiated, ii. determining, by a control unit, irradiation parameters corresponding to the devices identified by the identifier, iii. irradiating said electronic devices with at least one X-ray source confined in a X-ray-tight enclosure of an irradiation chamber capable of successively receiving a plurality of electronic devices to be brought into the chamber by a conveyor, the conveyor and said X-ray source being controlled by said control unit depending on said irradiation parameters including the power and duration of irradiation for erasing data contained in the non-volatile memory of said electronic devices.

19. The method according to claim 18, wherein irradiation parameters include a main axis of an X-ray beam generated by said source, this axis being tilted or tiltable with respect to the conveyor plane and the angle of this main axis being determined by said control unit by means of said identifier.

20. The method according to claim 18, wherein said identifying comprises a determination, by means of said identifier of the location and type of memory of devices to be irradiated, said control unit configured to control said conveyor and said X-rays source as a function of this location and type of memory determined during said irradiating.

21. The method according to claim 18, wherein the control unit drives the X-ray source by controlling the power and duration as a function of the type of memory contained in said electronic devices.

22. The method according to claim 18, wherein said irradiating comprises adjustment of the position of each of the successive devices relative to the source, depending on the components of the devices.

23. The method according to claim 18, further comprising positioning at least one protective mask between the source and the devices to protect certain components of the devices during exposure of the memories to the irradiation source.

* * * * *